(12) United States Patent
Zhang et al.

(10) Patent No.: US 8,222,873 B2
(45) Date of Patent: Jul. 17, 2012

(54) CURRENT MODE BANG-BANG REGULATOR AMPLIFIER

(75) Inventors: Wendong Zhang, Erie, PA (US); Hakam D. Hussein, Burnsville, MN (US)

(73) Assignee: Seagate Technology LLC, Cupertino, CA (US)

(*) Notice: Subject to any disclaimer, the term of this patent is extended or adjusted under 35 U.S.C. 154(b) by 373 days.

(21) Appl. No.: 12/683,303

(22) Filed: Jan. 6, 2010

(65) Prior Publication Data

US 2011/0163730 A1    Jul. 7, 2011

(51) Int. Cl.
*G05F 1/613* (2006.01)
(52) U.S. Cl. .................. 323/224; 323/284
(58) Field of Classification Search .......... 323/224, 323/283, 284
See application file for complete search history.

(56) References Cited

U.S. PATENT DOCUMENTS

| 5,283,726 | A  | * | 2/1994  | Wilkerson ............... 363/41 |
| 6,188,206 | B1 | * | 2/2001  | Nguyen et al. ............ 323/222 |
| 6,583,610 | B2 | * | 6/2003  | Groom et al. ............ 323/288 |
| 6,906,499 | B2 |   | 6/2005  | Hussein et al. |
| 7,035,124 | B2 | * | 4/2006  | Chadwick et al. ........... 363/40 |
| 7,132,818 | B2 |   | 11/2006 | Matsuura |
| 7,157,892 | B1 |   | 1/2007  | Ritter |
| 7,515,393 | B2 |   | 4/2009  | Bliley et al. |

* cited by examiner

*Primary Examiner* — Shawn Riley
(74) *Attorney, Agent, or Firm* — David K. Lucente

(57) ABSTRACT

A circuit for regulating voltage in a power driver, the circuit comprising a current amplifier adapted to measure current flowing through an input resistor, separate AC and DC components of the current flowing through an input resistor, and apply an AC gain factor to the AC component and a DC gain factor to the DC component.

20 Claims, 7 Drawing Sheets

CURRENT MODE BANG-BANG REGULATOR AMPLIFIER

SUMMARY

Implementations described herein provide a current amplifier circuit that removes an in-line resistor from a typical CMBB regulator and allows both load transient performance and noise immunity to be optimized simultaneously. An example CMBB regulator according to the presently disclosed technology includes a current amplifier circuit within a controller and a power driver circuit. The controller couples a controller output to a feedback input of the power driver circuit.

The current amplifier circuit includes a sense resistor, an output resistor, and a gain and filter circuit. The gain and filter circuit measures a voltage drop across the sense resistor to determine the power driver output current. Since the resistance value of the sense resistor is related to the resistance value from the power driver output and through the load, the current in amplifier output is related to the current of the power driver output and can be positive or negative. The gain and filter circuit then separates AC and DC current information and applies separate gain factors to the AC and DC current information. AC and DC current information modified by the gain factors is then recombined and used to pass current through the output resistor.

A current amplifier output voltage, which is a combination of Vout and the current flowing across the sense resistor, is input to a comparator circuit that provides a comparator output that indicates whether the current amplifier output voltage is above, equal to, or below a desired voltage level. The comparator output is then used to provide feedback control to the power driver circuit. The current amplifier output voltage and Vout are fed into a soft start/current limiter that limits a voltage difference between the current amplifier output voltage and Vout during a start-up time to provide a soft start.

Other implementations are also described and recited herein.

BRIEF DESCRIPTIONS OF THE DRAWINGS

DETAILED DESCRIPTIONS

A typical current mode bang-bang (CMBB) regulator uses an in-line sense resistor (e.g., a discrete resistor or a copper trace resistor) to sense power driver current. However, the in-line resistor can be undesirable because the resistor takes space on a CMBB circuit board, consumes power output from a power driver circuit to a load, and adds an expense to the circuit. Still further, typical CMBB regulators cannot be optimized to simultaneously improve both load transient performance and noise immunity (i.e. signal-to-noise ratio (SNR)). Generally, lower in-line sense resistor values improve load transient performance but worsen noise immunity. Similarly, higher in-line sense resistor values improve noise immunity but worsen load transient performance.

Figure 1:
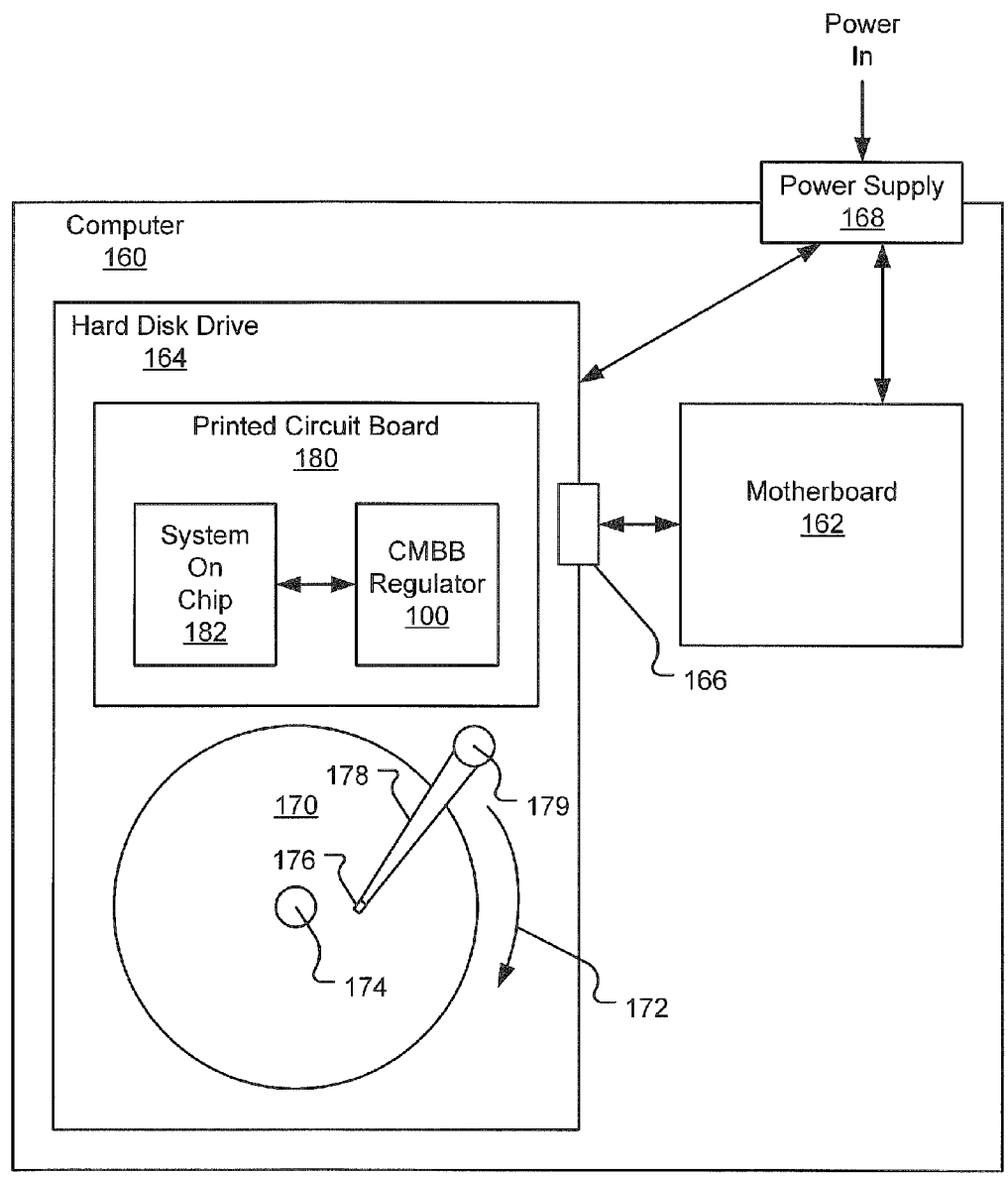
FIG. 1 illustrates an example computer equipped with a motherboard and a hard disk drive with an improved CMBB regulator.

FIG. 1 illustrates an example computer 160 equipped with a motherboard 162 and a hard disk drive (HDD) 164 with an improved CMBB regulator 100. The computer 160 is any server, desktop, laptop, or other computing system. The computer, 160, for example, operatively couples various system components (e.g., HDD 164) using at least the motherboard 162. In one implementation, the motherboard 162 and the HDD 164 are connected together via a Serial ATA interface 166, however, other connection schemes are contemplated. Through the motherboard 162, the computer controls operation of the HDD 164.

Both the motherboard 162 and the HDD 164 are powered by a power supply 168 that may convert incoming AC power to DC power, step down an incoming voltage, step-up the incoming voltage, and/or limit current available to the motherboard 162 and the HDD 164. In one implementation, power for the HDD 164 comes from the power supply 168 through the motherboard 162.

The HDD 164 is equipped with a disk pack 170, which is mounted on a spindle motor (not shown). The disk pack 170 includes one or more individual disks, which rotate in a direction indicated by arrow 172 about a central axis 174. Each disk has an associated disc read/write head slider 176 for communication with the disk surface. The slider 176 is attached to one end of an actuator arm 178 that rotates about a pivot point 179 to position the slider 176 over a desired data track on a disk within the disk pack 170.

Figure 7:
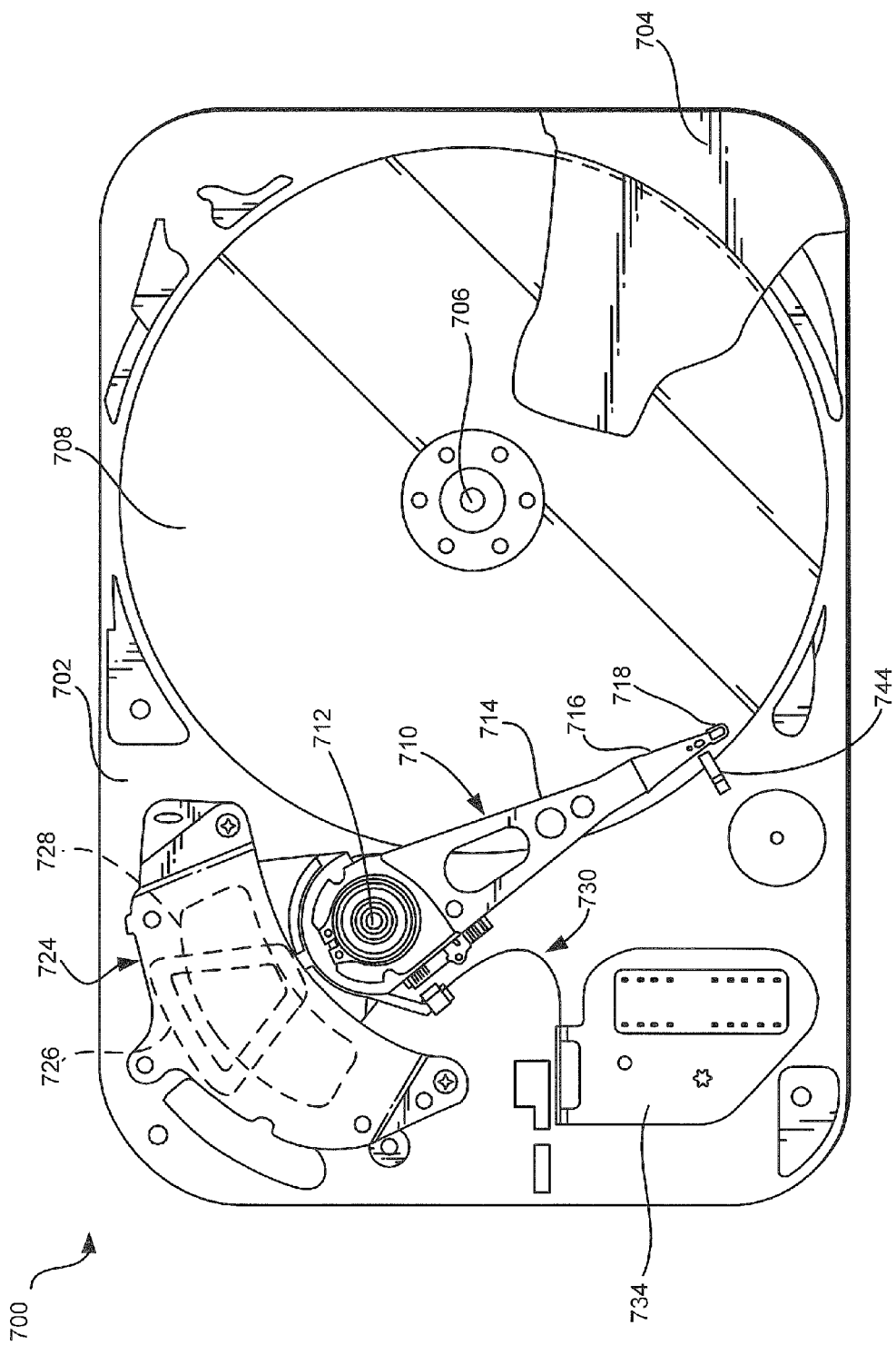
FIG. 7 illustrates a plan view of an example disc drive.

The HDD 164 is also equipped with a printed circuit board (PCB) 180 that controls operation of the HDD 164. The PCB 180 may include a system-on-a-chip (SOC) 182 that combines some, many, or all functions of the PCB 180 on a single integrated circuit. Alternatively, the functions of the PCB 180 may be spread out over a number of integrated circuits within one package (i.e., SIP). In the implementation of FIG. 1, the improved CMBB regulator 100, discussed further with regard to FIGS. 2-6, regulates voltages within the SOC 182 used to write and/or read data from the disk pack 170. The HDD 164 is discussed further with regard to FIG. 7.

Figure 2:
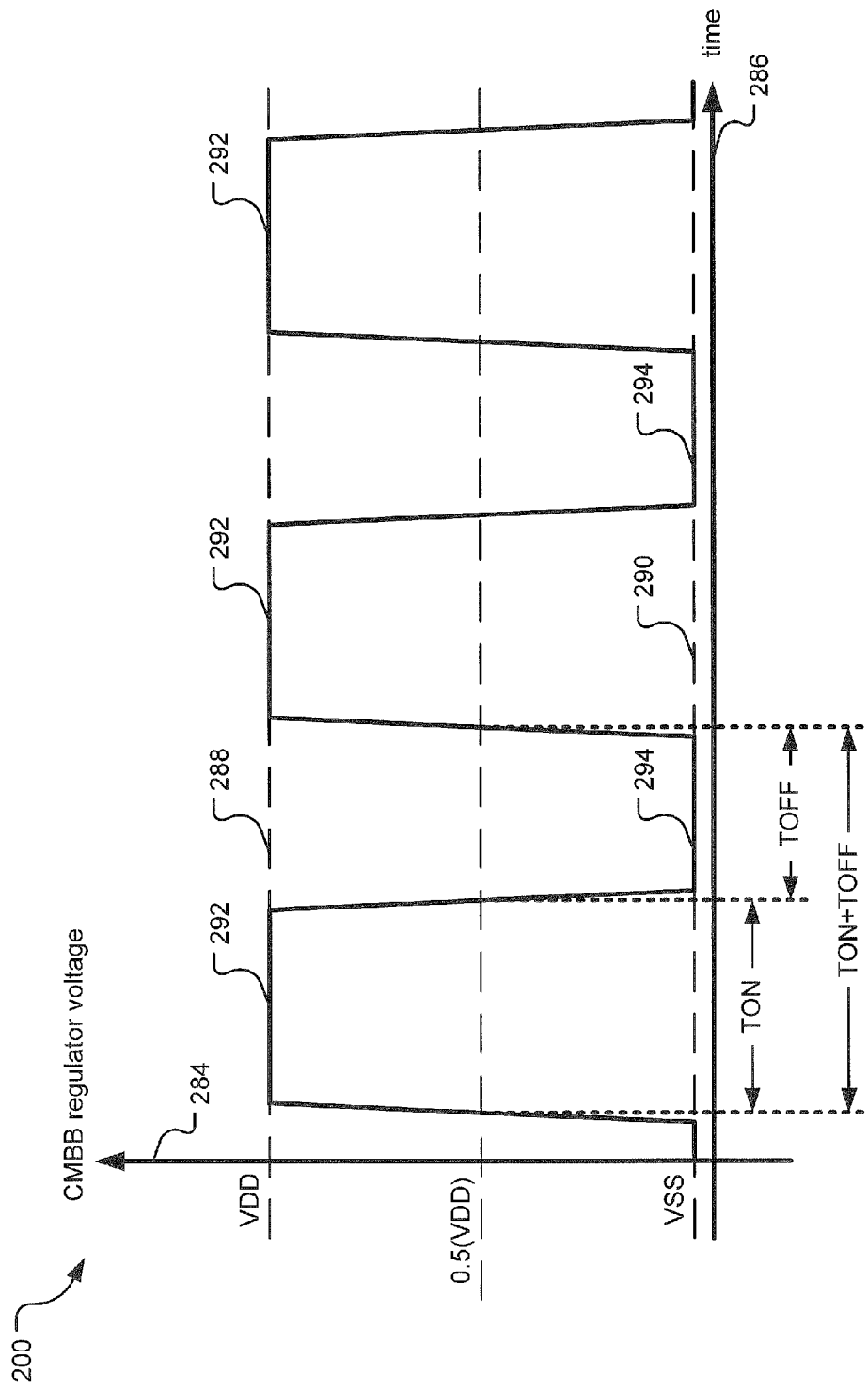
FIG. 2 illustrates an idealized power driver output waveform in an improved CMBB regulator.

FIG. 2 illustrates an idealized power driver output waveform 200 in an improved CMBB regulator. A vertical axis 284 represents power driver output voltage and a horizontal axis 286 represents time. A power driver circuit includes switches that alternatively connect the driver output to voltage VDD at 288 or voltage VSS at 290, with transitional or switching intervals separating the conduction times of the switches to ensure that both switches are not conducting at the same time.

The power driver output alternates between ON pulses 292 and OFF pulses 294 as illustrated. Each ON pulse 292 has an on time TON. Each off time interval 294 has an off time TOFF. A complete cycle of the power driver output can run from a start time of an ON pulse to a start time of the next-in-time ON pulse. The complete cycle has a time duration of TON+TOFF. A duty cycle of the power driver output is defined as DUTY CYCLE=TON/(TON+TOFF). A frequency of the power driver output is defined as 1/(TON+TOFF). The improved CMBB regulator, discussed with more specificity below, adapts actual power driver output to match the idealized power driver waveform as closely as possible in real time.

Figure 3:
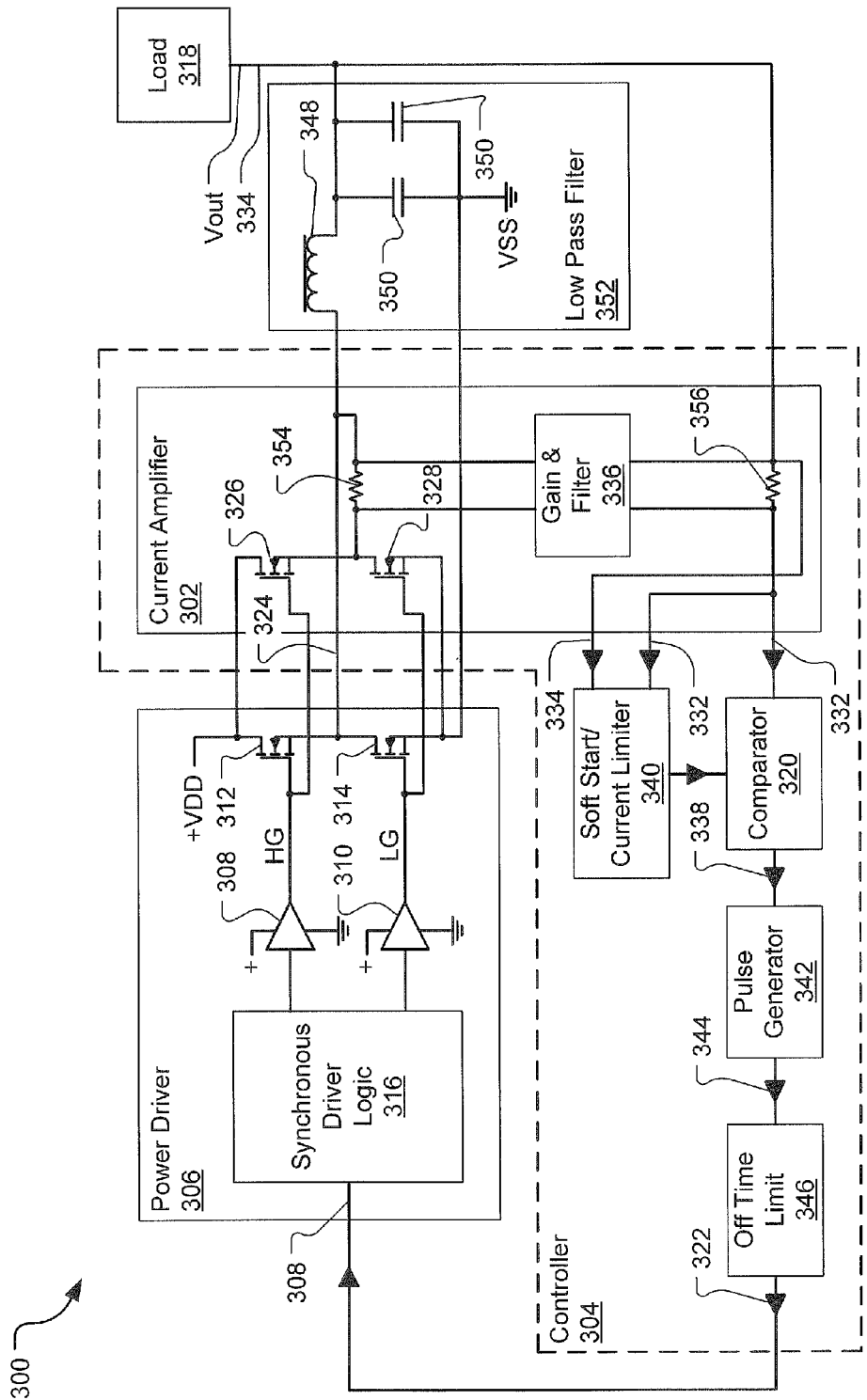
FIG. 3 illustrates an example improved CMBB regulator that includes a current amplifier circuit within a controller and a power driver circuit.

FIG. 3 illustrates an example improved CMBB regulator 300 that includes a current amplifier circuit 302 within a controller 304 and a power driver circuit 306. The controller 304 couples a controller output 322 to a feedback input 308 of the power driver circuit 306. The power driver circuit 306 includes synchronous driver logic 316, a high-side (HS) gate driver 308, a low-side (LS) gate driver 310, a high-side (HS) power transistor 312, and a low-side (LS) power transistor 314 (e.g., MOSFETS). The power driver circuit 306 alternatively connects a power driver output 324 to a positive voltage drain (VDD) or common DC voltage source (VSS), with transitional or switching intervals separating the conduction times of the transistors 312, 314 to ensure that both the transistors 312, 314 are not conducting at the same time.

More specifically, activating the HS transistor 312 connects the positive VDD rail to the power driver output 324 and activating the LS transistor 314 connects the DC common VSS to the power driver output 324. The synchronous driver logic 316 ensures that only one of the transistors 312, 314 is activated at any particular instant, thereby avoiding a short circuit between the VDD and the VSS rails. Alternation between the HS transistor 312 and the LS transistor 314 results in a periodic power driver output signal between ON pulses (VDD magnitude) and OFF pulses (VSS magnitude).

There is also a sense HS transistor 326 and a sense LS transistor 328 within the current amplifier 302 that are each operated in parallel with the transistors 312, 314 but have an amplifier output that is connected to the sense resistor 354 before proceeding to the load 418. The sense HS transistor 326 may act as a current mirror to the HS transistor 312 and similarly, the sense LS transistor 328 may act as a current mirror to the LS transistor 314. The current mirrors copy current through one active device (e.g., HS transistor 312) by controlling current in another active device (e.g., sense HS transistor 326) of a circuit, keeping the load current constant regardless of loading. In one implementation, the sense HS transistor 326 and the sense LS transistor 328 create a current proportional to the current through HS transistor 312 and LS transistor 314, respectively, but with less magnitude to pass through the sense resistor 354. As a result, sense resistor 354 has no effect on Vout 334 in the improved CMBB regulator 300. Various types of solid state switches (e.g., MOSFETS, BJTs, FETS) may be used as the transistors 312, 314, 326, and 328 and free wheeling diodes may be placed across the transistor outputs, as needed or desired.

The HS or LS output of drivers 308, 310 couples the power driver output 324 to a load 318, and maintains a relatively constant load voltage Vout 334 at the load 318. Further, a low pass filter 352 may be coupled to the power driver output 324 to reduce high frequency noise that reaches the load 318. The low pass filter 352, for example, may include an inductor 348 and one or more capacitors 350.

The current amplifier circuit 302 obtains and separates AC and DC current information flowing across a sense resistor 354, with these AC and DC components being equal or related to the power driver output 324 current. The current amplifier circuit 302 then converts the AC and DC current information into separate AC and DC voltages. A gain and filter circuit 336 may separately filter and/or amplify the AC voltage and DC voltage. The filtered and/or amplified AC voltage and DC voltage are then recombined and are used to pass current through an output resistor 356. The operation of the current amplifier circuit 302 will be discussed in more detail with regard to FIGS. 3 and 4.

The controller output 322 has a duty cycle that varies as a function of the current amplifier output voltage 332 from the current amplifier circuit 302. The controller 304 provides closed loop control of the power driver circuit 306. The duty cycle at controller output 322 is constant when the power driver output 324 current is fixed and variable when the power driver output 324 current is variable.

The current amplifier output voltage 332 is based on a combination of Vout 334 and the current flowing through output resistor 356. The current flowing through output resistor 356 is related to the voltage drop across sense resistor 354 according to the gain and filter circuit 336. The controller 304 also includes a comparator circuit 320 that receives the current amplifier output voltage 332 and provides a comparator output 338 that indicates whether the current amplifier output voltage 332 is above, equal to, or below a reference voltage level. The controller 304 further includes a soft start/current limiter 340 that limits a voltage difference between the current amplifier output voltage 332 and Vout 334 during a start-up time to provide a soft start. The soft start/current limiter 340 prevents large inrush currents from occurring during the start-up time.

The controller 304 also includes a pulse generator 342 that receives the comparator output 338. The comparator output 338 controls or triggers the pulse generator 342 to generate and output a pulsing signal 344. The pulsing signal 344 has a fixed pulse width when the comparator output 338 indicates that the current amplifier output voltage 332 is equal to the desired level. Spacing between the fixed pulses in the pulsing signal 344 (i.e., the duty cycle) are adjusted for changes in the load 318. In some implementations, the fixed pulse width corresponds to ON pulses (VDD magnitude). In other implementations, the fixed pulse width corresponds to OFF pulses (VSS magnitude).

The controller 304 further includes a time limit circuit 346 that receives the pulsing signal 344 from the pulse generator 342. The time limit circuit 346 passes on or replicates a portion of the pulses within the pulsing signal 344 as the controller output 322. The time limit circuit 346 may pass on some, most, or all of the fixed pulses within the pulsing signal 344 based on the spacing between the fixed pulses. While the time limit circuit 346 generally passes most of the pulses on to the controller output 322, when the fixed pulses are too closely spaced, the time limit circuit 346 blanks, or does not pass, some of the closely spaced fixed pulses to the controller output 322. In effect, the time limit circuit 346 limits a time between fixed pulses of the pulsing signal 344 from the pulse generator 342 to a minimum value. More specifically, when the pulsing signal 344 includes ON pulses, the time limit circuit 346 limits an OFF time to a minimum value. Similarly, when the pulsing signal 344 includes OFF pulses, the time limit circuit 346 limits an ON time to a minimum value. The minimum time value (either ON or OFF) limits a frequency of a noise at the power driver output 324 to a maximum frequency.

In various implementations, one or more of the controller 304, power driver circuit 306, and low pass filter 352 are foamed as an integrated circuit or a multi-chip module. Other functional blocks can also be included in the integrated circuit. Further, the components of the integrated circuit may be produced on one silicon chip for low-cost production. Still further, the integrated circuit may be predominantly a digital integrated circuit, thus limiting the use of complex linear amplifier circuitry that is space intensive on a silicon chip. In one example implementation, the controller 304 and the power driver circuit 306 are formed in the integrated circuit.

As a result, the only components of the improved CMBB regulator 300 outside of the integrated circuit are the low pass filter 352 and the load 318.

Figure 4:
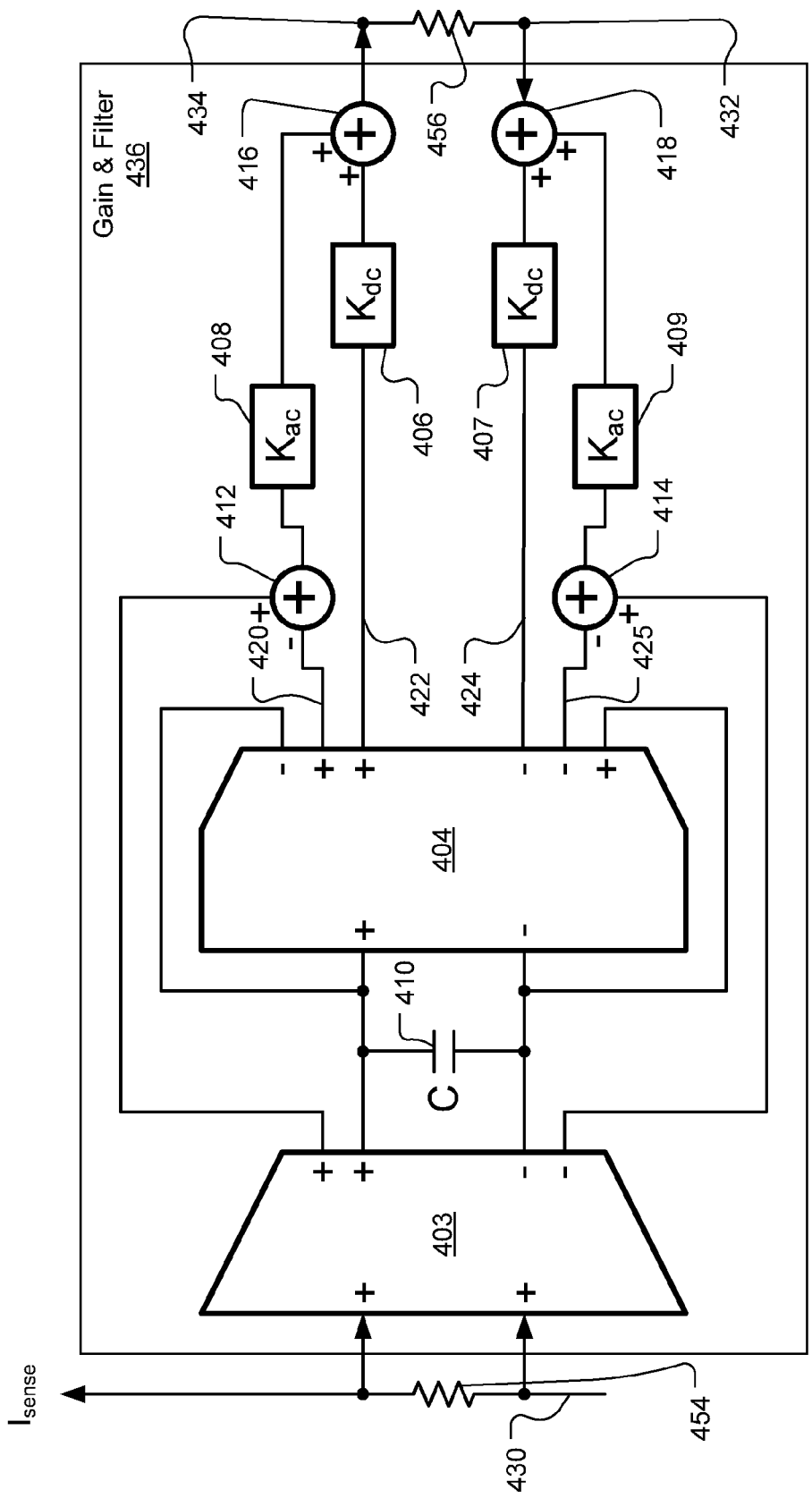
FIG. 4 illustrates an example current amplifier circuit connected to a power driver circuit and a load.
Figure 5:
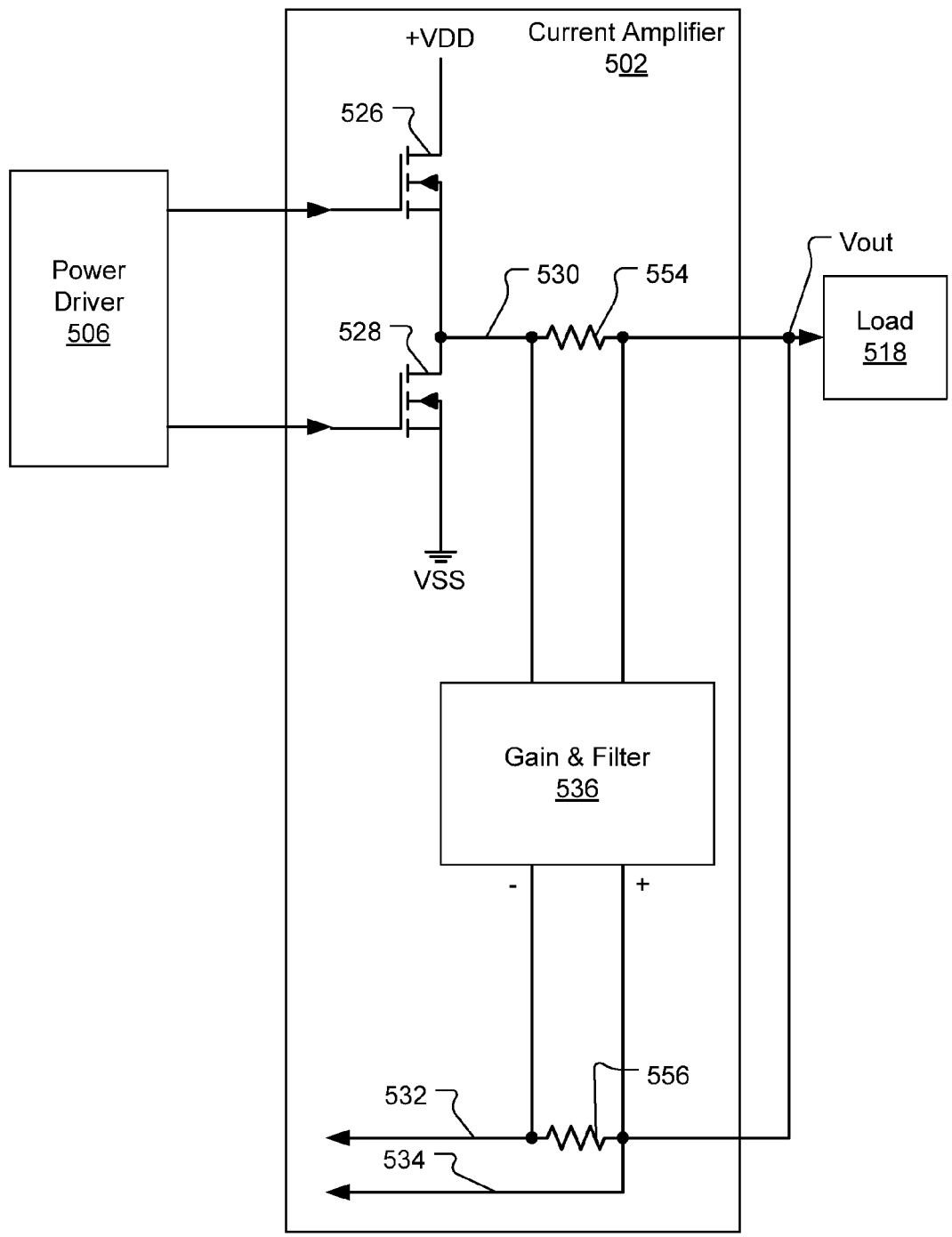
FIG. 5 illustrates an example gain and filter circuit that separates and independently amplifies AC and DC components of an amplifier current.
Figure 6:
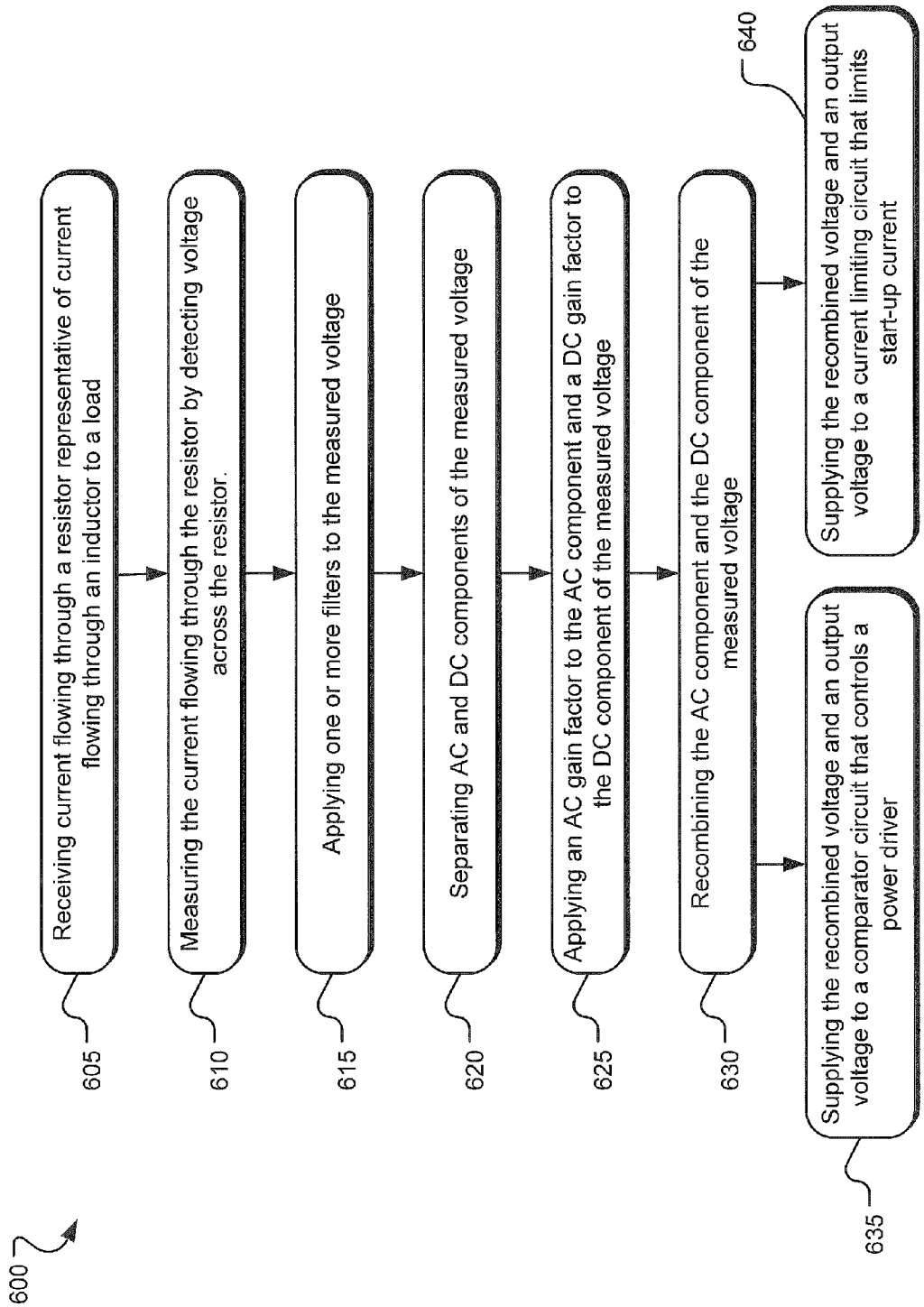
FIG. 6 illustrates example operations for separately amplifying AC and DC components of a power driver output current and using the amplified current for an improved CMBB regulator control.

FIG. 5 illustrates an example current amplifier circuit 502 that is connected to a power driver circuit 506 and a load 518. The current amplifier circuit 502 includes sense transistors 526, 528, a sense resistor 554, an output resistor 556, and a gain and filter circuit 536. Similar to the power driver circuit 306 of FIG. 3, the current amplifier circuit 502 of FIG. 4 is equipped with an HS transistor 526 and a LS transistor 528. The sense transistors 526, 528 are operated in parallel with the transistors 312, 314 (shown in FIG. 3) but have an amplifier output 530 that is connected to the sense resistor 554 before proceeding to the load 518. More specifically, activating the sense HS transistor 526 connects a positive VDD rail to the amplifier output 530 and activating the LS transistor 528 connects a DC common VSS to the amplifier output 530. In the implementation shown, only the HS sense transistor 526 or the LS sense transistor 528 is operated at any given time to prevent a short circuit condition between VDD and VSS. In one implementation, the sense HS transistor 526 and the sense LS transistor 528 create a current proportional to the current through HS transistor 312 and LS transistor 314 of FIG. 3, respectively, but with less magnitude to pass through the sense resistor 554.

FIG. 4 illustrates a gain and filter circuit 436 that separates and independently amplifies AC and DC components of a sense current. The gain and filter circuit 436 measures a voltage drop across the sense resistor 454 to determine the current in amplifier output 430. The gain and filter circuit 436 then separates AC and DC current information in the amplifier output 430 and converts the AC and DC current information into a separate AC voltage and a DC voltage that passes current through the output resistor 456. The gain and filter circuit 436 may also separately filter and/or amplify the AC voltage and DC voltage. Freedom to choose different gains for the AC and DC components of the amplifier output 430 allows both load transient performance and noise immunity to be improved since DC current step controls load current transient performance and AC current amplitude controls noise immunity. In one implementation, gain for the AC component is greater than the gain for the DC component to optimize transient performance and noise immunity.

Again with reference to FIG. 5, the resistance value of the active sense transistor (i.e. HS sense transistor 526 or LS sense transistor 528) is, in one implementation, much larger than the resistance of the sense resistor 554. Voltage across the output resistor 556 forms a floating voltage that is added to the output voltage (Vout). This floating voltage acts as a ripple component to the output voltage that is used to control switching frequency in an improved CMBB regulator. Thus, Vout and voltage across the sense resistor 554 are fed back into the control loop. More specifically, the following equation defines the current across the output resistor 556.

$$I_{sense} = K_{sense} * \{K_{dc} * F_{LPF}[I_{inductor}] + K_{ac} * F_{HPF}[I_{inductor}]\}$$

where, $I_{sense}$ is the current through the sense resistor 554;

$K_{sense}$ is a current gain ratio of sense transistor 526, 528 and a main transistor 312, 314, which is a function of the resistance of the sense resistor 554;

$K_{dc}$ is a DC component gain applied by the gain and filter circuit 536;

$F_{LPF}$ is a low pass filter function;

$I_{inductor}$ is current through an output inductor;

$K_{ac}$ is an AC component gain applied by the gain and filter circuit 536; and $F_{HPF}$ is a high pass filter function.

Returning to FIG. 4, the gain and filter circuit 436 measures a voltage drop across a sense resistor 454 to determine the current ($I_{sense}$) flowing to a load. The voltage drop is fed into a transconductance filter/amplifier (e.g., $G_m$ filter 403) that applies a gain that converts the voltage across sense resistor 454 to current through sense resistor 454. Positive and negative outputs of the $G_m$ filter 403 are fed into another transconductance filter/amplifier that is also equipped with a capacitor (e.g., $G_m$-C filter 404) that may incorporate a low-pass filter and may use a capacitor 410 to remove the AC component of the calculated current through sense resistor 454 and output positive and negative voltages corresponding only to the DC component of the calculated current through sense resistor 454.

In a first branch 422 of the gain and filter circuit 436, a DC gain factor ($K_{dc}$) 406 is applied to the positive output of the $G_m$-C filter 404. In a second branch 420 of the gain and filter circuit 436, the positive output of the $G_m$-C filter 404 is subtracted from the positive output of $G_m$ filter 403 in subtraction block 412 resulting in only the positive AC component of the calculated current through the sense resistor 454. An AC gain factor ($K_{ac}$) 408 is applied to the AC component of the positive calculated current through sense resistor 454.

In a third branch 424 of the gain and filter circuit 436, a DC gain factor ($K_{dc}$) 407 is applied to the negative output of the $G_m$-C filter 404. In a fourth branch 425 of the gain and filter circuit 436, the negative output of the $G_m$-C filter 404 is subtracted from the negative output of $G_m$ filter 403 in subtraction block 414 resulting in only the negative AC component of the calculated current through the sense resistor 454. An AC gain factor ($K_{ac}$) 409 is applied to the AC component of the negative calculated current through sense resistor 454.

Addition block 416 combines the DC positive output of the $G_m$-C filter 404 with the AC positive output of the $G_m$-C filter 404 after application of $K_{dc}$ 406 and $K_{ac}$ 408. Addition block 418 combines the DC negative output of the $G_m$-C filter 404 with the AC negative output of the $G_m$-C filter 404 after application of $K_{dc}$ 407 and $K_{ac}$ 409. The resulting combined positive and negative outputs of the $G_m$-C filter 404 are used to pass current through an output resistor 456 and the resulting voltage across the output resistor 456 is used for feedback control of an improved CMBB regulator.

More specifically, current amplifier output voltage 432, which is a combination of Vout 434 and the current flowing across sense resistor 454, is input to a comparator circuit that provides a comparator output that indicates whether the current amplifier output voltage 432 is above, equal to, or below a desired voltage level. The comparator output is then used to provide feedback control to a power driver circuit. The current amplifier output voltage 432 and Vout 434 may also be fed into a soft start/current limiter that limits a voltage difference between the current amplifier output voltage 432 and Vout 434 during a start-up time to provide a soft start.

An RC filter may be used in place of the $G_m$-C filter 404, however, the $G_m$-C filter 404 may be preferred due to a smaller capacitance requirement. In the implementation shown, only one filter is used to selectively implement both a low-pass and high-pass filter. Use of one filter circuit minimizes the amount of die size occupied by the $G_m$-C filter 404. In other implementations, two parallel $G_m$-C filters may be used, one high-pass and one low-pass. A low-pass transfer function of the $G_m$-C filter 404 is shown below.

$$I_{out}/I_{in} = 1/(1+sc/G_{m1})$$

where,

I.sub.out is current flowing out of the $G_m$-C filter 404;
I.sub.in is current flowing into the $G_m$-C filter 404;
c is capacitance of the $G_m$-C filter 404; and
Gm1 is transconductance gain of the $G_m$-C filter 404.

A high-pass transfer function of the $G_m$-C filter 404 may be achieved by using a signal minus output of the low-pass filter. An example high-pass transfer function of the $G_m$-C filter 404 is shown below. The high-pass and low-pass transfer functions are frequency domain representations of filter response of the $G_m$-C filter 404.

$$I_{out}/I_{in} = 1 - 1/(1+sc/G_{m1}) = sc/G_{m1}/(1+sc/G_{m1})$$

An example calculation of the current across the output resistor 456 as a function of the current across the sense resistor 454 is as follows.

$$I_{output} = (K_{dc} + K_{ac}) \cdot I_{sense} - K_{ac} \cdot F_{LPF}[I_{sense}]$$
$$= K_{dc} \cdot I_{sense} + K_{ac} \cdot \{1 - F_{LPF}[I_{sense}]\} = K_{dc} \cdot I_{sense} + K_{ac} \cdot F_{HPF}[I_{sense}]$$

where,

I.sub.output is current through the output resistor 456;
K.sub.dc is a DC component gain applied by the gain and filter circuit 436;
K.sub.ac is an AC component gain applied by the gain and filter circuit 436;
I.sub.sense is current through the sense resistor 454;

What is claimed is:

1. A method comprising:
    combining a modified AC component obtained by applying an AC gain factor to an AC component of a current flowing through an input resistor with a modified DC component obtained by applying a DC gain factor to a DC component of the current flowing through the input resistor.

2. The method of claim 1, further comprising:
    measuring a voltage drop across the input resistor to find the AC component of the current flowing through the input resistor and the DC component of the current flowing through the input resistor.

3. The method of claim 2, wherein a low-pass filter is applied to the measured voltage to reduce noise.

4. The method of claim 1, wherein the current flowing through the input resistor is related to current flowing to a load.

5. The method of claim 1, wherein the modified AC component is used to regulate driver voltage switching frequency.

6. The method of claim 1, wherein the modified DC component is used to limit start-up current in a power driver.

7. The method of claim 1, wherein a voltage drop across the input resistor does not directly affect power driver output voltage.

8. A circuit comprising:
    a current amplifier adapted to measure current flowing through an input resistor, separate AC and DC components of the current flowing through the input resistor, and apply an AC gain factor to the AC component and a DC gain factor to the DC component.

9. The circuit of claim 8, wherein the current flowing through the input resistor is measured using a differential voltage across the input resistor and the AC and DC components of the current are represented by voltages.

10. The circuit of claim 8, wherein the current amplifier is further adapted to recombine the AC and DC components of the current and pass the recombined current through an output resistor using the recombined current.

11. The circuit of claim 9, further comprising:
    a comparator adapted to compare an AC component of the measured voltage with a reference voltage and output an indication of whether the measured voltage is above or below the reference voltage.

12. The circuit of claim 9, further comprising:
    a current limiter adapted to limit a DC component of the measured voltage during start-up time to provide a soft start.

13. The circuit of claim 11, further comprising:
    a pulse generator adapted to generate and output a pulsing signal with a fixed pulse width corresponding to the reference voltage.

14. The circuit of claim 13, further comprising:
    a time limiter adapted to limit a time between the fixed pulses of the pulsing signal to a minimum value.

15. The circuit of claim 13, wherein the power driver is adapted to receive the pulsing signal from the pulse generator and alternatively connect a power driver output to a positive VDD or common DC VSS in sequence with the pulsing signal.

16. The circuit of claim 15, further comprising:
    a low-pass filter adapted to remove high-frequency noise from the power driver output.

17. The circuit of claim 8, wherein a voltage drop across the input resistor does not directly affect power driver output voltage.

18. A method comprising:
    proportionally replicating a load current as a sense current applied to an input resistor;
    detecting a voltage drop across the input resistor;
    calculating the load current based on the voltage drop across the input resistor;
    varying voltage output from the current amplifier based on the load.

19. The method of claim 18, wherein the input resistor is coupled in parallel with a load current path.

20. The method of claim 18, wherein the varied voltage output from the current amplifier is used to generate a feedback current that controls a power driver output waveform.

* * * * *